US008829734B2

(12) United States Patent
Gulak et al.

(10) Patent No.: US 8,829,734 B2
(45) Date of Patent: Sep. 9, 2014

(54) METHOD AND SYSTEM FOR MAXIMUM ACHIEVABLE EFFICIENCY IN NEAR-FIELD COUPLED WIRELESS POWER TRANSFER SYSTEMS

(71) Applicants: Glenn Gulak, Toronto (CA); Meysam Zargham, Toronto (CA)

(72) Inventors: Glenn Gulak, Toronto (CA); Meysam Zargham, Toronto (CA)

( * ) Notice: Subject to any disclaimer, the term of this patent is extended or adjusted under 35 U.S.C. 154(b) by 0 days.

(21) Appl. No.: 14/148,590

(22) Filed: Jan. 6, 2014

(65) Prior Publication Data

US 2014/0191585 A1 Jul. 10, 2014

Related U.S. Application Data

(60) Provisional application No. 61/749,368, filed on Jan. 6, 2013, provisional application No. 61/878,021, filed on Sep. 15, 2013.

(51) Int. Cl.
 H01F 27/42 (2006.01)
 H01F 37/00 (2006.01)
 H01F 38/00 (2006.01)
 H01F 38/14 (2006.01)
(52) U.S. Cl.
 CPC ...................... *H01F 38/14* (2013.01)
 USPC ........................................................ 307/104
(58) Field of Classification Search
 CPC ......... H02J 5/005; H02J 17/00; H02J 7/0042; H02J 7/0072
 USPC .......................................... 307/104; 320/108
 See application file for complete search history.

(56) References Cited

U.S. PATENT DOCUMENTS

2009/0243394 A1* 10/2009 Levine ........................... 307/104

OTHER PUBLICATIONS

G. Wang, W. Liu, M.Sivaprakasam, and G. Alperkendir, "Design and analysis of an adaptive transcutaneous power telemetry for biomedical implants," IEEE Trans. Circuits Syst. I, vol. 52, No. 10, pp. 2109-2117, Oct. 2005.
C. Sauer, M. Stanacevic, G. Cauwenberghs, and N. Thakor, "Power harvesting and telemetry in CMOS for implanted devices," IEEE Trans. Circuits Syst. I, vol. 52, No. 12, pp. 2605-2613, Dec. 2005.
F. Inanlou and M. Ghovanloo, "Wideband near-field data transmission using pulse harmonic modulation," IEEE Trans. Circuits Syst. I, vol. 58, No. 1, pp. 186-195, Jan. 2011.
M. Ghovanloo and K. Najafi, "A modular 32-site wireless neural stimulation microsystem," IEEE J. Solid-State Circuits, vol. 39, No. 12, pp. 2457-2466, Dec. 2004.

(Continued)

Primary Examiner — Carlos Amaya
(74) Attorney, Agent, or Firm — McAndrews, Held & Malloy, Ltd.

(57) ABSTRACT

Methods and systems for maximum efficiency achievable in near-field coupled wireless power transfer systems are disclosed and may include configuring coil geometry, independently of load impedance and source impedance, for a transmit (Tx) coil and a receive (Rx) coil based on a media expected to be between the coils during operation. A desired susceptance and conductance may be determined and an impedance of an amplifier for the Tx coil may be configured based on the determined susceptance and conductance. A load impedance for the Rx coil may be configured based on the determined susceptance and conductance. A matching network may be coupled to the amplifier. The Rx coil may be integrated on a complementary metal-oxide semiconductor (CMOS) chip. One or more matching networks may be integrated on the CMOS chip for the configuring of the load impedance for the Rx coil.

30 Claims, 11 Drawing Sheets

(56) References Cited

OTHER PUBLICATIONS

R. R. Harrison, P. T. Watkins, R. J. Kier, R. O. Lovejoy, D. J. Black, B. Greger, and F. Solzbacher, "A low-power integrated circuit for a wireless 100-electrode neural recording system," IEEE J. Solid-State Circuits, vol. 42, No. 1, pp. 123-133, Jan. 2007.

Z. Zumsteg, C. Kemere, S. O'Driscoll, R. E. Ahmed, G. Santhanam, K. V. Shenoy, and T. Meng, "Power feasability of implantable digital spike-sorting circuits for neural prosthetic systems," IEEE Trans. Neural Syst. Rehabil. Eng., vol. 13, No. 3, pp. 272-279, Sep. 2005.

S. B. Lee, H. M. Lee, M. Kiani, U. Jow, and M. Ghovanloo, "An inductively powered scalable 32-channel wireless neural recording system-on-a-chip for neuroscience applications," IEEE Trans. Biomed. Circuits Syst., vol. 4, No. 6, pp. 360-371, Dec. 2010.

A. Shameli, A. Safarian, A. Rofougaran, M. Rofougaran, J. Castaneda, and F. D. Flaviis, "A UHF near-field RFID system with fully integrated transponder," IEEE Trans. Microw. Theory Tech., vol. 56, No. 5, pp. 1267-1277, May 2008.

A. Radecki, H. Chung, Y. Yoshida, N. Miura, T. Shidei, H. Ishikuro, and T. Kuroda, "6w/25mm2 inductive power transfer for non-contact wafer-level testing," in Proc. IEEE International Solid-State Circuits Conf. (ISSCC'11), Feb. 2011, pp. 230-232.

W. H. Ko, S. P. Liang, and C. Fung, "Design of radio-frequency powered coils for implant instruments," Med. Biol. Eng. Comput., vol. 15, pp. 634-640, Nov. 1977.

U. Jow and M. Ghovanloo, "Design and optimization of printed spiral coils for efficient transcutaneous inductive power transmission," IEEE Trans. Biomed. Circuits Syst., vol. 1, No. 3, pp. 193-202, Sep. 2007.

E. Hochmair, "System optimization for improved accuracy in transcutaneous signal and power transmission," IEE Trans. Biomed. Circuits Syst., vol. BME-31, No. 2, pp. 177-186, Feb. 1984.

C. M. Zierhofer and E. S. Hochmair, "Coil design for improved power transfer efficiency in inductive links," in Proc. IEEE Engineering in Medicine and Biol. Conf., Nov. 1996, pp. 1538-1539.

A. Ramrakhyani, S. Mirabbasi, and M. Chiao, "Design and optimization of resonance-based efficient wireless power delivery systems for biomedical implants," IEEE Trans. Biomed. Circuits Syst., vol. 5, No. 1, pp. 48-63, Feb. 2011.

K. Silay, C. Dehollain, and M. Declercq, "Improvement of power efficiency of inductive links for implantable devices," in Proc. Research in Microelectronics and Elect. Conf., Apr. 2008, pp. 229-232.

G. Simard, M. Sawan, and D. Massicotte, "High-speed OQPSK and efficient power transfer through inductive link for biomedical implants," IEEE Trans. Biomed. Circuits Syst., vol. 4, No. 3, pp. 192-200, Jun. 2010.

M. W. Baker and R. Sarpeshkar, "Feedback analysis and design of RF power links for low-power bionic systems," IEEE Trans. Biomed. Circuits Syst., vol. 1, No. 1, pp. 28-38, Mar. 2007.

R. R. Harrison, "Designing efficient inductive power links for implantable devices," in Proc. IEEE International Symp. on Circuits Sys. (ISCAS'07), May 2007, pp. 2080-2083.

HFSS 12 Reference Manual, ANSYS Technologies, Canonsburg, PA, 2010.

ADS 2009 Momentum, Reference Manual, Agilent Technologies, Mississauga, ON, 2009.

A. Y. Poon, S. O'Driscoll, and T. H. Meng, "Optimal frequency for wireless power transmission into dispersive tissue," IEEE Trans. Antennas Propag., vol. 58, No. 5, pp. 1739-1749, May 2010.

J. Olivo, S. Carrara, and G. D. Micheli, "Energy harvesting and remote powering for implantable biosensors," IEEE Sensors J., vol. 11, No. 7, pp. 1573-1586, Jul. 2011.

T. Lee, The Design of CMOS Radio-Frequency Integrated Circuits, 2nd ed. Cambridge, 2004.

A. Kurs, A. Karalis, R. Moffatt, J. D. Joannopoulos, P. Fisher, and M. Soljacic, "Wireless power transfer via strongly coupled magnetic resonances," Science Express, vol. 317, pp. 83-86, Jul. 2007.

D. M. Pozar, Microwave Engineering, 3rd ed. New York: Wiley, 2004.

K. Finkenzeller, RFID Handbook: Fundamentals and Applications in Contactless Smart Cards and Identification, 2nd ed. New York: Wiley, 2003.

M. Zargham and P. G. Gulak, "Maximum achievable efficiency in near-field coupled power-transfer systems," IEEE Trans. Biomed. Circuits Syst., vol. 6, No. 3, pp. 228-245, Jun. 2012.

F. Svelto, S. Deantoni, and R. Castello, "A 1.3 GHz low-phase noise fully tunable CMOS LC VCO," IEEE J. Solid-State Circuits, vol. 35, No. 3, pp. 356-361, Mar. 2000.

J. Yoon, Y. Choi, B. Kim, Y. Eo, and E. Yoon, "CMOS-compatible surface-micromachined suspended-spiral inductors for multi-GHz silicon RF ICs," IEEE J. Solid-State Circuits, vol. 23, No. 10, pp. 591-593, Oct. 2002.

\* cited by examiner

METHOD AND SYSTEM FOR MAXIMUM ACHIEVABLE EFFICIENCY IN NEAR-FIELD COUPLED WIRELESS POWER TRANSFER SYSTEMS

CROSS-REFERENCE TO RELATED APPLICATIONS/INCORPORATION BY REFERENCE

This application claims priority to U.S. Provisional Application 61/749,368, filed on Jan. 6, 2013, and U.S. Provisional Application 61/878,021, filed on Sep. 15, 2013, each of which is hereby incorporated herein by reference in its entirety.

FIELD

Certain embodiments of the invention relate to wireless power transfer. More specifically, certain embodiments of the invention relate to a method and system for maximum efficiency achievable in near-field coupled wireless power transfer systems.

BACKGROUND

Wireless power transfer (WPT) is important to many emerging applications and is commonly realized by means of near-field inductive coupling. This type of power delivery system is advantageously used for biomedical implants, neural activity monitoring/stimulation, emerging lab-on-chip (LoC) applications, RFID, and non-contact testing.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method for maximum efficiency achievable in near-field coupled wireless power transfer systems, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION OF THE INVENTION

Certain aspects of the invention may be found in a method and system for maximum efficiency achievable in near-field coupled wireless power transfer systems. The method and system may comprise configuring coil geometry, independently of load impedance and source impedance, for a transmit (Tx) coil and a receive (Rx) coil based on a media expected to be between the coils during operation. A desired susceptance and conductance corresponding to the configured coil geometry and expected media may be determined and a desired load impedance of an amplifier for the Tx coil may be configured based on the determined susceptance and conductance. A load impedance for the Rx coil may be configured based on the determined susceptance and conductance. A matching network may be coupled to the amplifier for the configuring of the impedance of the amplifier. The Rx coils may be integrated on a complementary metal-oxide semiconductor (CMOS) chip. One or more matching networks may be integrated on the CMOS chip for the configuring of the load impedance of the Rx coil. The one or more matching networks may comprise an impedance bank consisting of circuit elements such as capacitors and/or inductors in various configurations that may be adaptively configured by being switched in and out according to an algorithm. A portion of a matching network for configuring the load impedance for the Rx coil may be mounted to a surface of the CMOS chip. Similarly, a matching network may be coupled to the Tx coil for the configuring the load impedance for the Tx coil. The Tx coil may be integrated on a printed circuit board (PCB) or other insulating substrate. The desired susceptance and conductance may be configured for a maximum power transmission efficiency. The coil geometry and expected media may comprise a general two-port model. The coil geometry may comprise one or more of: coil area, metal layer thickness, metal layer width, and metal layer spacing. Control commands and/or data may be communicated by the Tx and Rx coils. The expected media may comprise one or more of: biological liquid, organic or inorganic substances, biological material, biological agents, biological tissue, chemical compositions, buffer solutions.

Figure 1:
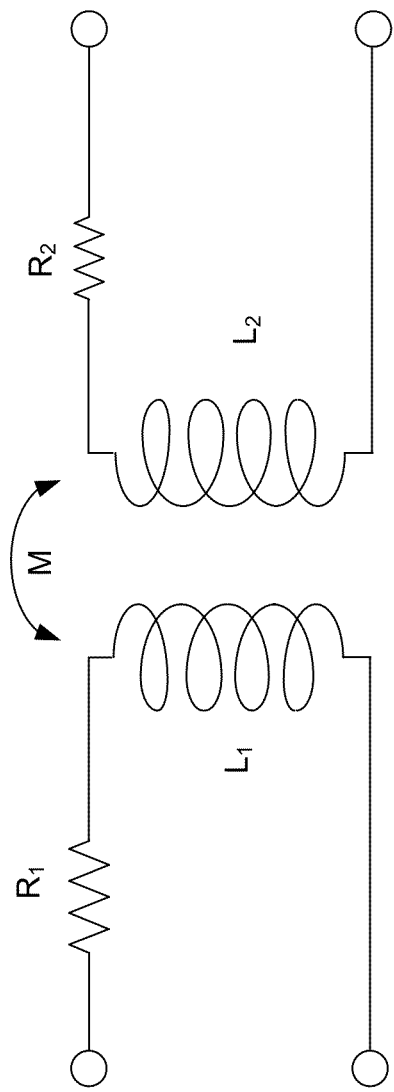
FIG. 1 is a diagram illustrating inductive wireless transfer, in accordance with an example embodiment of the disclosure.

FIG. 1 is a diagram illustrating inductive wireless transfer, in accordance with an example embodiment of the disclosure. Referring to FIG. 1, there is shown a coil L1 adjacent to coil L2, where both coils have a non-zero resistance indicated by resistors R1 and R2. The mutual inductance due to the proximity of the coils is indicated by "M" and may be a measure of the amount of current induced in one coil due to a changing current in the other coil.

The arrangement shown in FIG. 1 represents a simple form of inductive wireless power transfer through air. The maximum achievable power efficiency, $\eta_{max}$, from the input to the output may be given by $$\eta_{max} = \frac{k^2 Q_1 Q_2}{\left(1 + \sqrt{1 + k^2 Q_1 Q_2}\right)^2}. \tag{1}$$

where $Q_1$ and $Q_2$ are the quality factor for each of the inductors and k is the coupling factor between the two coils.

The power efficiency of a near-field link is a measure of: (i) the power loss in circuits both at the transmitter and receiver, (ii) the absorbed electromagnetic energy in media in between the coils that causes the local temperature to increase (possibly harming biological tissue, or biological agents in a LoC application), and (iii) how often the battery has to be recharged when used in the context of portable medical devices. Therefore, in the case of biomedical implant applications, low-efficiency wireless power transmission implementations may cause discomfort and possible complications for the patients using an implant. Similar issues occur in the case of laboratory-on-chip applications where the local temperature of a small 10 to 100 µL biological sample being measured needs to be held within strict tolerances (often within one Centigrade degree). Therefore, it is not possible to arbitrarily increase the strength of the electromagnetic fields to realize greater power transfer to the embedded system. In most applications, achieving high power-efficiency is extremely challenging due to the restriction on the geometry of the inductive media.

The term "media" in this disclosure may comprise any liquid, gas, solid, or combination thereof and may include organic or inorganic substances, biological material, biological agents, biological tissue, chemical compositions, buffer solutions, and solutes in a solvent, for example. Accordingly, the coils may be configured based on what type of material, or media, is to be measured or assessed.

Other techniques for link optimization use a simple inductor model in air for fixed load impedance at low frequencies. In most practical applications, the inductive two-port may be designed using numerical electromagnetic simulation software packages such as HFSS or Momentum that return S parameters. Extracting the simple R, L model from these parameters, especially at high frequency, is quite challenging. In addition, many wireless power transfer applications require the electromagnetic waves to pass through biological material such as skin, muscle, fat, buffer solutions, etc., which we refer to as a general two-port model. These media are conductive and have higher relative permittivity constants than air. Therefore, optimizing the link using a simple two-port model alone and ignoring the media during the optimization phase incurs large penalties in terms of achievable power efficiency. Ignoring the media results in a non-optimal coil design with reduced efficiency through biological media, for example.

The limitations of the two-port model at high frequencies may be addressed by using S-parameters under simultaneous conjugate matching. However, such matching resulting in maximum power transfer does not necessarily result in maximum efficiency. In fact, conjugate matching has a theoretical upper bound of 50% efficiency while a general two-port may be designed to have power efficiencies approaching 100%.

The mathematical derivations presented in this disclosure prove that, unlike conjugate matching, the optimum load is independent of the source impedance and solely depends on two-port parameters. Another shortcoming in classical link optimization techniques is the assumption of fixed load impedance. This assumption forces an extra unnecessary constraint on the design of the coupled inductors that could result in sub-optimal coil parameters. The power efficiency in such systems is generally between 30 to 50%.

The present disclosure introduces the concept of optimum load and source impedances. As a result, it effectively adds new design parameters to the system, beneficially decoupling the problem of loading effects from the optimization process of the link. This approach achieves power efficiencies of greater than 80% at much greater coil separations with significant advantage in practical realizations.

Previous techniques determined that there exists an optimum load for which the efficiency is maximized but resorted to numerical methods to find the optimum load. Furthermore, these previous techniques used a simple two-inductor model in air, which suffers from the same shortcomings stated earlier. Other previous techniques used a four-coil coupled system in an attempt to add a degree of freedom to the effect of load and source impedance on the power efficiency of the system. However, any method of impedance transformation introduces additional losses due to the finite quality factor of the components. In the case of four-coil systems, the transformation may be carried out using coils with limited quality factor. Furthermore, having four coupled coils increases the cost, size, complexity of design and enforces several constraints on the inductor geometry.

The method and system disclosed here may use discrete capacitors and inductors as the matching network, where the capacitors may have Q values higher than 1000. Matching networks that use only capacitors tend to have lower penalties in terms of efficiency compared to a four-coil system. The present disclosure optimizes the near-field link based on the general two-port parameters of the network. Accordingly, the present disclosure addresses the concept of optimum load for any passive two-port network and a simple closed-form expression for the maximum achievable power efficiency of the given two-port.

In this system, the circuits contained in the implant, the laboratory-on-chip or the silicon substrate are remotely powered by means of a power amplifier operating at a fixed carrier frequency. Additional functionality may be achieved by modulating the load, circuit topology, carrier frequency, or signal amplitude, in some manner to realize unidirectional or bidirectional control commands and data transfer between Tx and Rx coils. In another example scenario, one or more antennas and associated transceiver circuitry may be integrated on a CMOS chip or PCB for the Tx and Rx coils, with the one or more antennas communicating control commands and/or data while the Tx and Rx coils provide power and/or sensing capability.

The present disclosure also introduces a simple criterion on the two-port parameters to maximize power transfer efficiency. Moreover, the results are applicable to any form of passive power transfer such as inductive or capacitive coupling. These derivations provide a powerful tool for modifying the simple two-port inductor model to the more complicated but realistic general form (e.g. adding the conductance between the two coils to model the conductivity of media) and quickly observing the effects on the efficiency and optimum loading in the system.

The improved efficiency realized by the present disclosure, without loss of generality, allows for the useful and practical integration of the receiver coil on the same silicon substrate as the circuits, and without requiring special processing layers or post-processing.

Aspects of the disclosure enable maximizing the power transfer efficiency through a near field coupled network and providing a closed form analytical solution for calculating the optimum load that would maximize the efficiency of power transfer through any passive network. Aspects of the present disclosure enable techniques that are capable of correctly predicting the power transfer efficiency at any frequency, through CMOS substrate and biological or chemical media. Through the introduction of the concept called optimum load, the present disclosure decouples the design of the coils from the load. Therefore, the coils may be optimized independently of the load while fully considering the media surrounding the coils. The optimum load may be realized using matching networks. However, these matching networks are usually lossy and affect the maximum achievable power efficiency. In this disclosure, these issues are addressed and matching stages are provided to achieve optimum efficiency.

Figure 2:
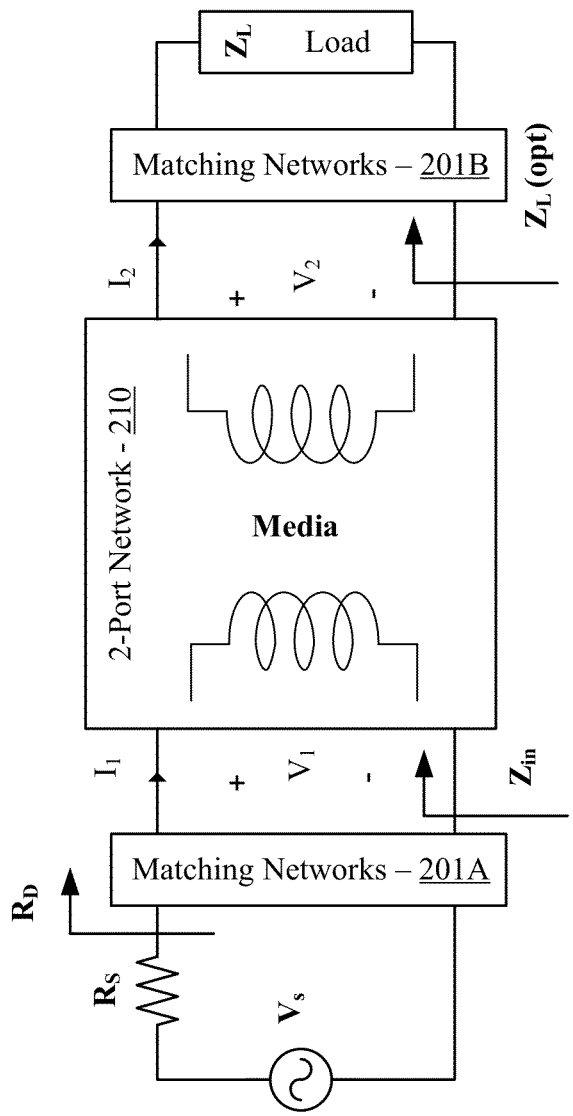
FIG. 2 shows a general form of wireless power transfer through a passive network, in accordance with an example embodiment of the disclosure.

FIG. 2 shows a general form of wireless power transfer through a passive network, in accordance with an example embodiment of the disclosure. Referring to FIG. 2, there is shown a 2-port network 210 that may comprise a pair of mutually inductive coils in this example, similar to the coils shown in FIG. 1. The matching networks 201A and 201B may comprise networks, banks, or arrays of fixed or adjustable inductors and capacitors, or alternatively only capacitors, that may be operable to provide a desired impedance that matches a calculated impedance or impedances for the 2-port network 210. In an example scenario, the matching networks 201A and 201B may comprise an array of switched capacitors and/or, which may be integrated on-chip with one of the coils in the 2-port network 210.

The matching networks 201A and 201B may be integrated on a CMOS chip, on a PCB or other insulating substrate, or portions of them may be directly mounted on the CMOS chip. Depending on the Q-factor requirement and/or the available space on-chip or PCB, the matching networks and coils may be integrated in each of these locations or in any combination. For example, a large portion of the matching networks 201A and 201B may be integrated on one or more CMOS chips that may or may not also include the Tx or Rx coils, while large Q capacitors and/or inductors may be formed in or on, or bonded to, a PCB or other insulating substrate. Alternatively, large Q capacitors and/or inductors may be bonded directly to the one or more CMOS chips. In addition, the matching networks 201A and/or 201B may be dynamically configured to adapt to changing load or other conditions, such as temperature or the media itself changing, for example. In an example scenario, the matching networks 201A and 201B may switch inductance and/or capacitance elements in or out when a section of circuitry is enabled or disabled.

An important attribute of such a network is power transfer efficiency, or simply power efficiency. The power efficiency, η, or simply the efficiency, of the system may be defined as:

$$\eta = \frac{P_L}{P_S} \quad (2)$$

where $P_L$ is the power delivered to the load and $P_S$ is the power delivered by the source ($V_S$). The value of η depends on various parameters such as the load ($Z_L$), the source impedance ($R_S$), the impedance loading the source ($R_D$) and the two-port parameters. Therefore, to achieve the maximum possible efficiency in the system it is desirable to be able to freely choose the load ($Z_L$) and the desired input loading ($R_D$). As shown in FIG. 2, these impedance conversions may be realized using the matching networks 201A and 201B. In order to obtain the maximum possible efficiency of a two-port, the efficiency η for FIG. 2 may be derived, then introduce the conditions on $Z_L$ and $R_D$ that would result in the maximum possible value for equation (2). A general linear two-port may be represented in terms of its ABCD parameters:

$$V_2 = A \times V_1 + B \times I_1 \quad (3)$$

$$I_2 = C \times V_1 + D \times I_1. \quad (4)$$

Without loss of generality we choose the desired impedance, $R_D$, to be n times smaller than $R_S$.

$$R_D = \frac{R_S}{n}, \quad (5)$$

where n is an arbitrary positive real number. Therefore, the voltage at the input of the two-port due to the source is:

$$\left|\frac{V_1}{V_S}\right|^2 = \frac{n \cdot |Z_{in}|^2}{\text{Re}\{Z_{in}\} \cdot R_S} \times \frac{1}{(n+1)^2}, \quad (6)$$

where $Z_{in}$ is the impedance at the input of the two-port and Re{ } and Im{ } denote the real and the imaginary parts of the expression. In equation (6), it is assumed that the matching networks are lossless. The voltage $V_1$ may then be transformed by the two-port gain and shows up at the second port as $V_2$:

$$\left|\frac{V_2}{V_S}\right|^2 = \frac{n \cdot |Z_{in}|^2}{\text{Re}\{Z_{in}\} \cdot R_S} \times \frac{1}{(n+1)^2} \times \frac{|Z_L(opt)|^2}{|D \cdot Z_L(opt) - B|^2}. \quad (7)$$

This expression may be simplified by substituting $Z_{in}$ with its ABCD parameters:

$$Z_{in} = \frac{D \cdot Z_L(opt) - B}{A - C \cdot Z_L(opt)}, \quad (8)$$

which may be utilized to simplify equation (7) to:

$$\left|\frac{V_2}{V_S}\right|^2 = \frac{n}{\text{Re}\{Z_{in}\} \cdot R_S} \times \frac{1}{(n+1)^2} \times \frac{|Z_L(opt)|^2}{|A - C \cdot Z_L(opt)|^2}. \quad (9)$$

This relation may be utilized to calculate the power efficiency from $V_S$ to $Z_L$, where $Y_L$ is the admittance of the $Z_L$(opt):

$$\eta = \frac{1}{n+1} \times \frac{|Z_L(opt)|^2 \cdot \text{Re}\{Y_L\}}{|A - C \cdot Z_L(opt)|^2 \cdot \text{Re}\{Z_{in}\}}. \quad (10)$$

As expected, η is a function of $Z_L$. Therefore, there exists an optimum load $Z_L$(opt) that would maximize η. By maximizing equation (10) with respect to the real and imaginary parts of the load $Z_L(opt)$ and replacing the ABCD parameters with Z-parameters, it may be shown that the maximum achievable efficiency under optimum loading conditions in any passive two-port network is:

$$\eta_{max} = \frac{1}{n+1} \times \frac{\chi}{\left(1 + \sqrt{1+\chi}\right)^2}, \quad (11)$$

where $$\chi = \frac{|Z_{12}|^2}{rZ_{11}rZ_{22} - rZ_{12}^2} = \frac{|Y_{12}|^2}{rY_{11}rY_{22} - rY_{12}^2} \quad (12)$$

and $rZ_{ii}=\mathrm{Re}\{Z_{ii}\}$, $iZ_{ii}=\mathrm{Im}\{Z_{ii}\}$, $rY_{ii}=\mathrm{Re}\{Y_{ii}\}$ and $iY_{ii}=\mathrm{Im}\{Y_{ii}\}$. The value of $Z_L$ that allows for the maximum efficiency in equation (11) is given by:

$$rZ_L(opt) = \frac{\sqrt{(rZ_{11}rZ_{22} + iZ_{12}^2)(rZ_{11}rZ_{22} - rZ_{12}^2)}}{rZ_{11}}, \quad (13)$$

$$iZ_L(opt) = \frac{iZ_{12}rZ_{12}}{rZ_{11}} - iZ_{22}. \quad (14)$$

These relations illustrate that, in general, the proposed optimum load is not matched to the two-port. Therefore, the optimum power efficiency does not happen when the load is matched to the two-port. In fact, impedance matching would never result in efficiencies higher than 50% while equation (11) can theoretically be as high as 100%. The term $$\frac{1}{n+1}$$

in equation (11) is a function of $R_D$ and represents the efficiency from the source to the input of the two-port for a linear voltage source. The choice for $R_D$ depends on the input driver $V_S$. In practice, the two-port may be driven by a class-E power amplifier. Therefore, $$\frac{1}{n+1}$$

may be replaced by the efficiency of the employed power amplifier. Thus a more realistic form of equation (11) is given by:

$$\eta_{max} = \eta_{Amp} \times \frac{\chi}{\left(1 + \sqrt{1+\chi}\right)^2}, \quad (15)$$

where $\eta_{Amp}$ represents the power amplifier efficiency and $$\eta_{tp} = \frac{\chi}{\left(1 + \sqrt{1+\chi}\right)^2}, \quad (16)$$

is the two-port efficiency. The efficiency of a power amplifier is a function of its load, which may drive the choice of $R_D$.

There exists an optimum load, usually referred to as $R_{Lopt}$, which maximizes the power delivery efficiency of a power amplifier. The value of $R_{Lopt}$ is completely different from the small-signal output impedance of the power amplifier and is generally found using load-pull techniques. Therefore, to maximize the power from the source to the load, the two-port provides the appropriate ($R_D = R_{Lopt}$) loading for the power amplifier. The efficiency of a class-E power amplifier $\eta_{Amp}$ is theoretically 100% and in practice efficiencies higher than 75% are achievable. The second term in equation (11) is a function of two-port parameters. In order to maximize the power efficiency of the two-port, $\chi$ may be maximized.

Figure 3:
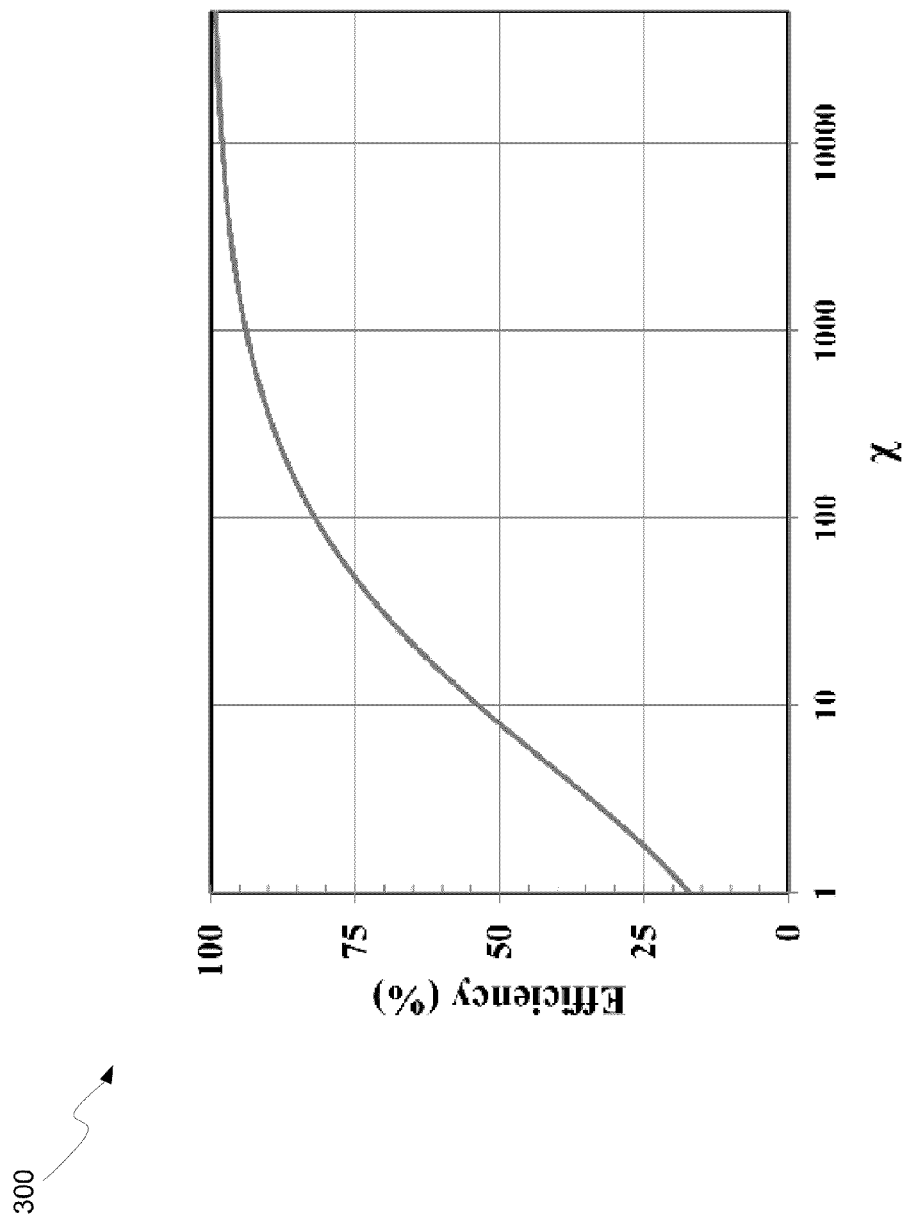
FIG. 3 shows the maximum possible power efficiency from the two-port to the load as a function of the variable $\chi$, in accordance with an example embodiment of the disclosure.

FIG. 3 shows the maximum possible power efficiency from the two-port to the load as a function of the variable $\chi$, in accordance with an example embodiment of the disclosure. Equations (13) and (14) represent the optimum series load. The equivalent parallel load is calculated in equations (17) and (18). These quantities are best represented in terms of the network Y parameters.

$$R_L(opt) = \frac{rY_{11}}{\sqrt{(rY_{11}rY_{22} + iY_{12}^2)(rY_{11}rY_{22} - rY_{12}^2)}}, \quad (17)$$

$$B_L(opt) = \frac{iY_{12}rY_{12}}{rY_{11}} - iY_{22}. \quad (18)$$

It is interesting to note that the well-established simultaneous conjugate matching, that is widely used in microwave amplifiers and maximizes power transfer, occurs in the special case where $R_D = R_S$. In this situation, the power efficiency=$G_T=P_L/P_{ave}$, where $P_{ave}$ is the maximum available power from the source, which is realized under a source matching condition ($R_D = R_S$). The result demonstrated in this disclosure agrees with the previously established $G_{Tmax}$, under a matched source condition. $G_{Tmax}$ has 50% as its upper bound for the efficiency.

The conversion of load impedance to the optimum load $Z_{Lopt}$ and the input impedance $Z_{in}$ to the desired impedance $R_D$ may be conducted through a filter commonly referred to as a matching network. Matching networks can transform any impedance with non-zero resistance to any desired resistance. The reactive part of the desired load is then easily adjusted by adding a reactive component in series or parallel. Therefore, without loss of generality, it is assumed that the matching network is transforming a general complex load to a purely resistive desired load. There are different types of matching networks to choose from, such as π, T, or L. In situations where the quality factor of the matching network is not enforced and efficiency is of primary concern, L-match is a good choice. Therefore, in this disclosure, the analysis is based on multi-section L-match networks. However, it is not limited to this type of matching network, as, similar derivations can easily be developed for other types of matching networks (π, T, capacitive and inductive transformers). L-match networks are aptly named as they consist of two elements that form an L-shape circuit.

Figure 4:
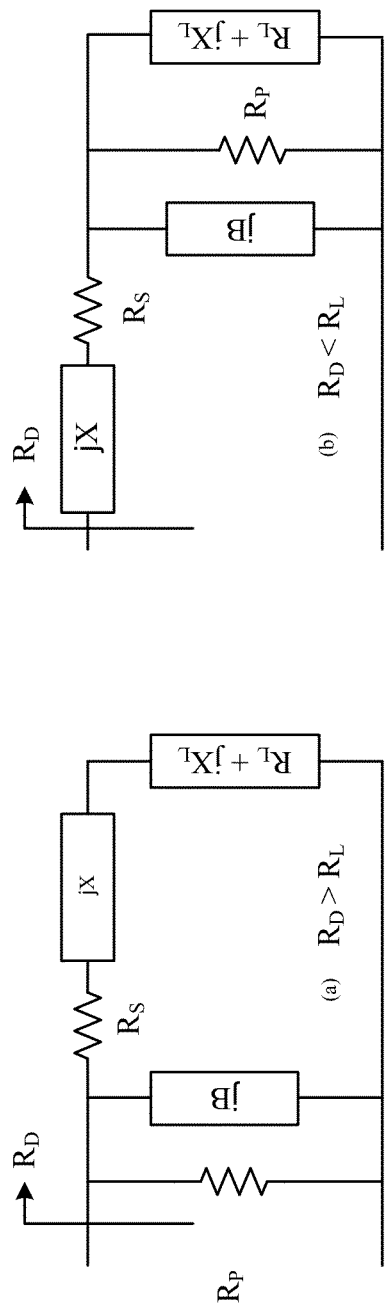
FIG. 4 is a diagram illustrating example matching network circuits, in accordance with an example embodiment of the disclosure.

FIG. 4 is a diagram illustrating example matching network circuits, in accordance with an example embodiment of the disclosure. Referring to FIG. 4, there are shown two L-match networks with circuit a) for instances when $R_D > R_L$ and circuit b) for instances where $R_D < R_L$.

Depending on whether the real part of the impedance needs to be increased or decreased, one of the two L-Section circuits in FIG. 4 may be used. The efficiency loss through the matching network may be due to the resistance of components used in the matching network. In the following analysis, it is assumed that the losses are small enough not to affect the impedance conversion operation of the network. We will first address circuit (a) where $R_D > R_L$. The Q of the L-match network is defined as:

$$Q = \sqrt{R_D/R_L - 1}. \quad (19)$$

Using (19), the value of the reactance X and susceptance B are given by, $$X = QR_L - X_L, \quad (20)$$

$$B = ((X + X_L) \cdot (1 + Q^{-2}))^{-1}. \quad (21)$$

Using equations (20) and (21), the portion of power loss due to $R_{Par}$ and $R_{Ser}$ may be calculated to be:

$$\frac{P_{loss}(R_{Par})}{P_{in}} = \frac{Q}{Q_P}, \quad (22)$$

$$\frac{P_{loss}(R_{Ser})}{P_{in}} = \frac{(1+Q^2)Q_S|Q_{Load} - Q|}{Q^2 Q_S^2 + (Q_{Load} + Q_S - Q)^2}, \quad (23)$$

where $Q_S = X/R_{Ser}$ and $Q_P = BR_{Par}$ are the Q of the series and parallel components used in the matching network and $Q_{Load} = |X_L|/R_L$ is the quality factor of the load. Assuming $Q_S \gg |Q_{Load} - Q|$, the total efficiency through the matching network for circuit (a) is found to be:

$$\eta_a = 1 - \frac{Q}{Q_P} - \frac{|Q_{Load} - Q|}{Q_S}. \quad (24)$$

The same procedure may be followed for circuit (b) where $R_D < R_L$. The quality factor in this case is given by:

$$Q = \sqrt{Re\{Y_D\}/Re\{Y_L\} - 1}. \quad (25)$$

The value of reactance X and the susceptance B for circuit (b) are given by:

$$B = Q \cdot Re\{Y_L\} - Im\{Y_L\}, \quad (26)$$

$$X = \frac{1}{(B + Im\{Y_L\})(1 + Q^{-2})}. \quad (27)$$

Using equations (26) and (27), the loss in the matching network is found to be:

$$\frac{P_{loss}(R_{Ser})}{P_{in}} = \frac{Q}{Q_S}, \quad (28)$$

$$\frac{P_{loss}(R_{Par})}{P_{in}} = \frac{(1+Q^2)Q_P|Q_{Load} - Q|}{Q^2 Q_P^2 + (Q_{Load} + Q_P - Q)^2}. \quad (29)$$

Assuming $Q_P \gg |Q_{Load} - Q|$, $$\eta_b = 1 - \frac{Q}{Q_S} - \frac{|Q_{Load} - Q|}{Q_P}. \quad (30)$$

On the load side, the load may be stepped down (commonly circuit (b)) and $Q_{Load} = Q$. On the source side, on the other hand, the load resistance may comprise the series resistance of the transmitter coil and is therefore small, which will be referred to as $Q_{coil}$, and therefore is illustrated by circuit (a). It can be determined that high efficiency occurs when the coils have high Q, such that $Q_{Load} \gg Q$. In such scenarios, the loss through the matching networks can be simplified to:

$$\eta_{source} = 1 - Q_{coil}/Q_S, \quad (31)$$

$$\eta_{load} = 1 - Q/Q_S - Q/Q_P. \quad (32)$$

Therefore, it is advantageous to use very high Q components. The transmitter inductors made using printed circuit board (PCB) traces have a Q between 50 and 250 in air, so that the series matching component on the source side may need to be a capacitor with a very high Q. On the load side, however, efficiency may be improved by reducing the effective Q. The Q of the matching network using one stage may become large, which may degrade the power efficiency of the conversion. This may be remedied by using multiple stages, each stage having $Q_i$. Using equation (32), the efficiency of each section i is:

$$\eta_i = 1 - Q_i/Q_S - Q_i/Q_P. \quad (33)$$

There exists an optimum number of stages that maximizes the total efficiency:

$$\eta = \prod_{i=1}^{N} \eta_i. \quad (34)$$

Using the proof presented in equations (53)-(59), all stages should provide equal impedance conversion and the optimum number of stages for large Q is:

$$N \approx \ln(Q). \quad (35)$$

Figure 5:
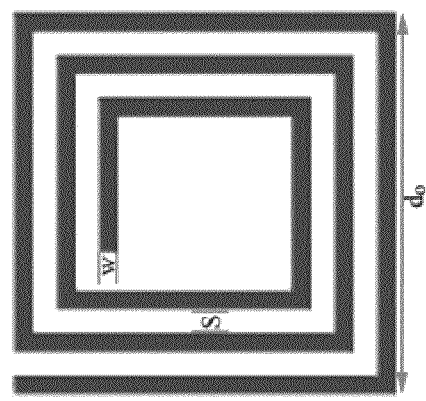
FIG. 5 shows the geometry of a PCB based coil, in accordance with an example embodiment of the disclosure.

FIG. 5 shows the geometry of a PCB based coil, in accordance with an example embodiment of the disclosure. The coil 500 is one example of a possible coil that may be used, and is shown as an example without loss of generality. PCB coils are popular due to the low fabrication cost and geometry flexibility. In the case of power transmission through biological or chemical media, the following design rules may be followed. The outer radius of the transmitter, in the case of circular loops, may satisfy $$r_{opt} \leq D\sqrt{2}$$

where D is the distance between the coils. This constraint is modified to $$d_o \leq D\sqrt{2(1+\sqrt{5})} \quad (36)$$

for the case of square coils. In the case of power transmission through biological or chemical media, the optimum transmitter, does not have many turns. In an example scenario, N≤3 was chosen. The trace width for the transmitter is generally large, in an example w≥1000 μm was used to achieve high Q. In addition, the transmitter coil may be tapered, especially at frequencies above 100 MHz.

Figure 6A:
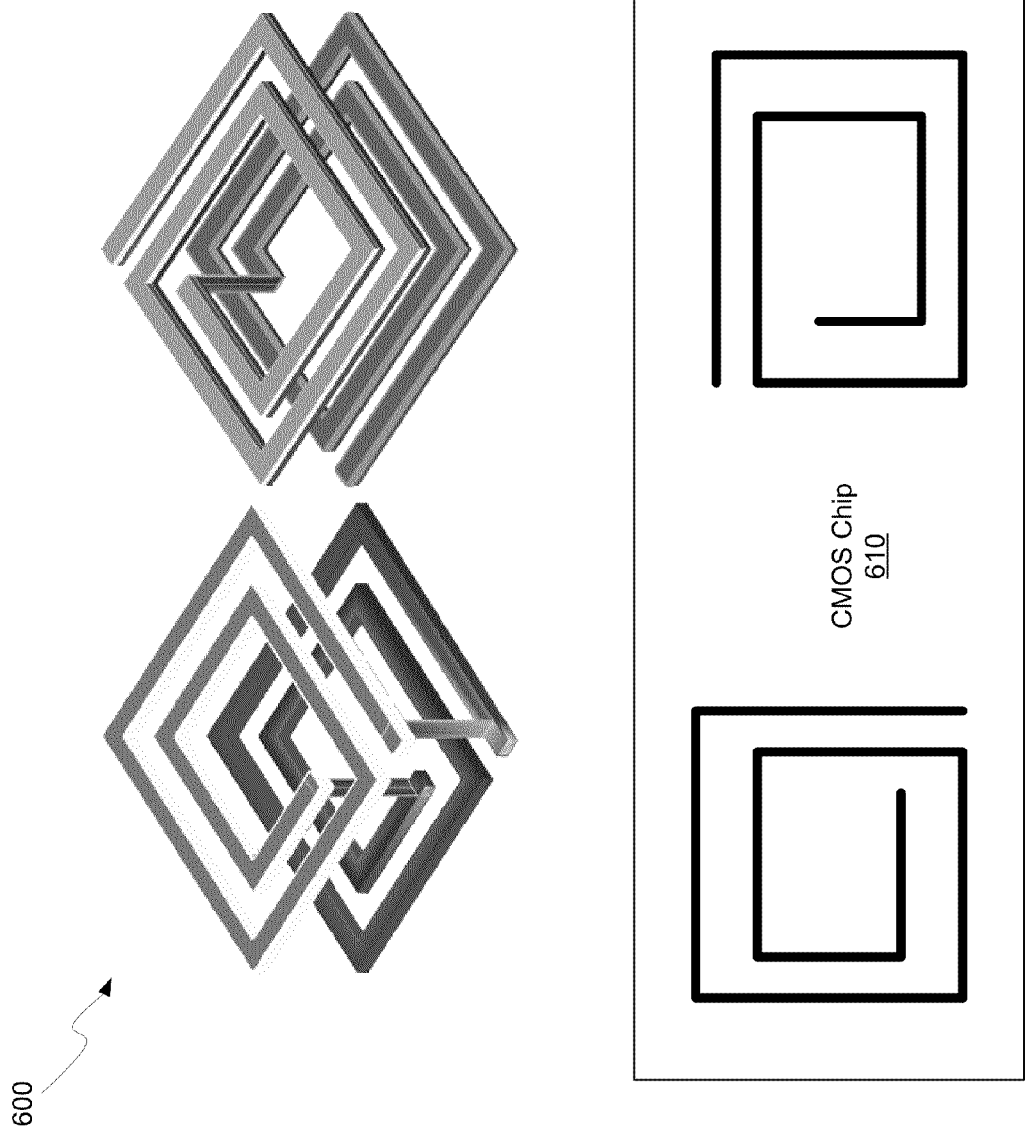
FIG. 6A shows the coils for a fully integrated CMOS receiver, in accordance with an example embodiment of the disclosure.

FIG. 6A shows the coils for a fully integrated CMOS receiver, in accordance with an example embodiment of the disclosure. In this example, the receiver coil, matching circuits and other electronics for the application are co-integrated on a CMOS substrate or CMOS chip 610. CMOS integrated coils follow the following guidelines: The optimum frequency of operation for integrated coils depends on the size of the receiver coil, substrate properties and the media between the coils. The optimum frequency for a CMOS integrated receiver coil with an area of 4 mm$^2$ to 25 mm$^2$ for a typical CMOS process tend to be between 80 MHz to 250 MHz, with 40.68 MHz as the closest ISM band. The outer dimension of the receiver coil (on a silicon die) may be the largest value permitted by the die as determined by cost and application constraints. In CMOS processes, two or three top metal layers in series or parallel or any combination of the two, would be one appropriate strategy to realize the receiver coil. In scenarios where the maximum allowed metal width is not satisfactory, one can use several parallel layers and short them as often as allowed by the process rules. Using metal layers in series will increase the rectifier optimum load, $R_L$, which may be suitable for low power electronic applications. Next optimizing two port power transfer efficiency may be performed utilizing an electromagnetic simulation with varying trace width, spacing, and the number of turns in the coil. This process typically converges quickly due to the constrained design space. Once the optimum geometry has been found, the optimum load and desired loading for the power amplifier can be independently realized using matching networks.

Figure 6B:
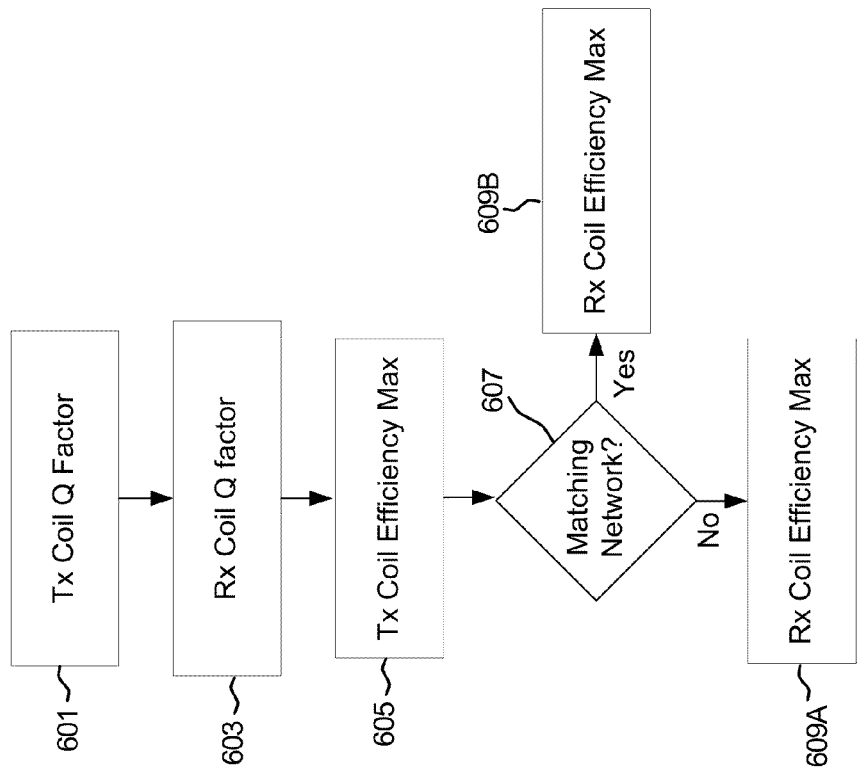
FIG. 6B shows example steps in the optimization process of coil geometry, in accordance with an example embodiment of the disclosure.

FIG. 6B shows example steps in the optimization process of coil geometry, in accordance with an example embodiment of the disclosure. The example steps may begin with step 601 where the transmitter coil quality factor may be maximized in the frequency range of interest. During this optimization step, the electromagnetic properties of the media in between the coils may be fully modelled. The optimization process may utilize a 2.5D or 3D electromagnetic simulation.

In step 603, the receiver coil quality factor may be maximized in the frequency range of interest. During this optimization step, the electromagnetic properties of the media in between the coils may be fully modelled, which may be particularly important when the media comprises biological material or liquids with biological agents, for example.

In step 605, the transmitter coil in the inductive link may be optimized in the presence of the receiver coil by optimizing the maximum achievable efficiency $\eta_{max}$.

In step 607, in situations where adding matching networks to the receiver side are not desirable, the example steps proceed to step 609A where Rx optimization may be carried out under optimum load constraint in accordance with $\eta_{max}$ and equation (45).

If matching networks are to be utilized, the example steps may proceed to step 609B, where the receiver coil in the inductive link may be optimized in the presence of the transmitter coil and matching network by optimizing the maximum achievable efficiency $\eta_{max}$.

The special case of inductive coupling for high power transfer through air requires hundreds of milliWatts to a few watts of power to be transferred to a receiver. In these scenarios, very small resistance values may be utilized, on the order of a few to tens of ohms. Therefore, in an example embodiment, $R_{Lopt}$ may be close to these values, thereby eliminating the need for a matching network on the load side and reducing the complexity. It is also worth noting that even in the case where a matching network is used, the efficiency through the matching network depends on how large of a transformation is needed. A series load therefore may be used for high power applications.

Figure 7:
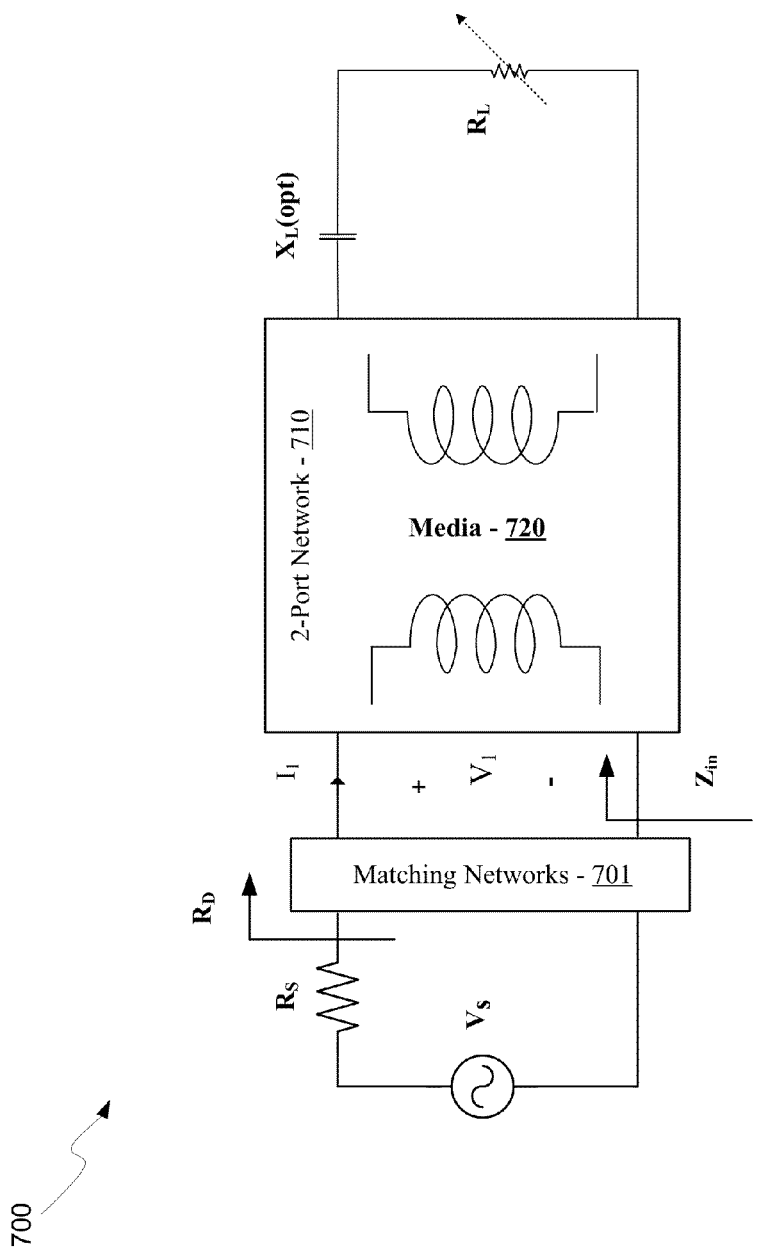
FIG. 7 illustrates a load configuration for optimized coil power transfer efficiency, in accordance with an example embodiment of the disclosure.

FIG. 7 illustrates a load configuration for optimized coil power transfer efficiency, in accordance with an example embodiment of the disclosure. Referring to FIG. 7, there is shown a 2-port network 710 and matching network 701. There is also shown a source signal $V_s$, source resistance $R_s$, input current $I_1$, input voltage $V_1$, input impedance $Z_{in}$, a variable load resistance $R_L$, and a load reactance $X_L$.

In these applications the power transfer media is air and therefore $rZ_{12} \cong 0$. The other assumption that may be applied is that the quality factor of the transmitter and receiver coils are much larger than 1. Under the given conditions, the optimum load reactance, in equation (14), and resistance in equation (13), simplify to $$Z_L = rZ_{22}\sqrt{1+\chi} - iQ_2 rZ_{22}. \tag{37}$$

Equation (37) shows that the imaginary part of the load is now independent of $\chi$, which makes it insensitive to misalignment and any change in the distance. Hence it may be fixed by design and independent of the transmitter coil, their distance, etc,. The resistive part, however, varies with $\chi$. The input impedance looking into the two port is also relevant to the transfer efficiency. Assuming a fixed load with an optimal reactance of $X_L = -iQ_2 rZ_{22}$ and a resistance equal to $$R_L = \alpha R_{Lopt} = \alpha rZ_{22}\sqrt{1+\chi},$$

the parameter α indicates how far the load is from the optimal load. Given the above load impedance, the input impedance of the two-port network may be calculated. A matching network on the transmitter side might be required to adaptively adjust the amplifier load according to the changes in the input impedance in equation (38).

$$Z_{in} = rZ_{11}\left(1 + \frac{\chi}{1+\alpha\sqrt{1+\chi}}\right) + iZ_{11} \tag{38}$$

In addition, the efficiency may be recalculated to be:

$$\eta = \frac{\alpha\chi}{(\alpha+\sqrt{1+\chi})(1+\alpha\sqrt{1+\chi})} \tag{39}$$

Note that the efficiency becomes maximum when α=1 and the optimum load is utilized. Therefore, optimum efficiency may be obtained by properly adjusting the load resistance or forcing α to be equal to 1. It is desirable for one to be able to choose any value of load resistance to maximize the efficiency. However in most applications, it is also very desirable for one to remove the complexity from the receiver side. Therefore one can eliminate the matching network from the load side and only choose from a finite discrete set of load values. Such adaptive systems are very well suited to electronic systems.

A practical question is how many different discrete resistances are needed to stay within β percent of the maximum achievable efficiency. In practical design scenarios, the maximum achievable efficiency through two-port systems for the fully aligned case would be approximately 90%, which maps to $\chi=350$ and the worst case power efficiency being considered is approximately 10%, with a corresponding $\chi$ of 0.5. These numbers do not account for losses through the power amplifier, rectifier and the internal circuitry. Using the above assumption, the largest and smallest values for the optimal resistance according to equation (37) are 18.8 $rZ_{22}$ and 1.22 $rZ_{22}$. If this range is divided into n different values, it may be calculated how far the system would be from optimum efficiency.

Table 1 shows the results for linear spacing of the load values. As seen by just using five different linear values for load, the efficiency can be within 5% of the maximum achievable efficiency. Table 2 shows the result for logarithmic spacing of the load values. It should be noted that even better efficiency may be obtained using non-linear spacing. In fact, with only 3 different values, the efficiency may be within 4% of the optimum efficiency.

TABLE 1

Efficiency versus linear spacing

| n | Worst case $\chi$ | Efficiency(%) | Efficiency loss(%) |
|---|---|---|---|
| 1 | 6.05 | 22.3 | 23 |
| 2 | 21.94 | 50 | 15.5 |
| 3 | 11.22 | 45.9 | 9.6 |
| 4 | 7.65 | 42.65 | 6.6 |
| 5 | 5.86 | 39.9 | 4.8 |
| 6 | 4.79 | 37.6 | 3.7 |
| 7 | 4.08 | 35.6 | 2.9 |
| 8 | 3.56 | 33.9 | 2.3 |
| 9 | 3.18 | 32.4 | 1.9 |
| 10 | 2.88 | 31.1 | 1.6 |

TABLE 2

Efficiency versus logarithmic load spacing

| n | Worst case $\chi$ | Efficiency(%) | Efficiency loss(%) |
|---|---|---|---|
| 1 | 6.05 | 22.3 | 23 |
| 2 | 21.94 | 50 | 15.5 |
| 3 | 4.87 | 37.8 | 3.8 |
| 4 | 21.94 | 63.5 | 1.9 |
| 5 | 10.6 | 53.5 | 1.1 |
| 6 | 21.94 | 64.8 | 0.7 |
| 7 | 13.56 | 58.0 | 0.5 |
| 8 | 9.53 | 52.5 | 0.36 |

Figure 8:
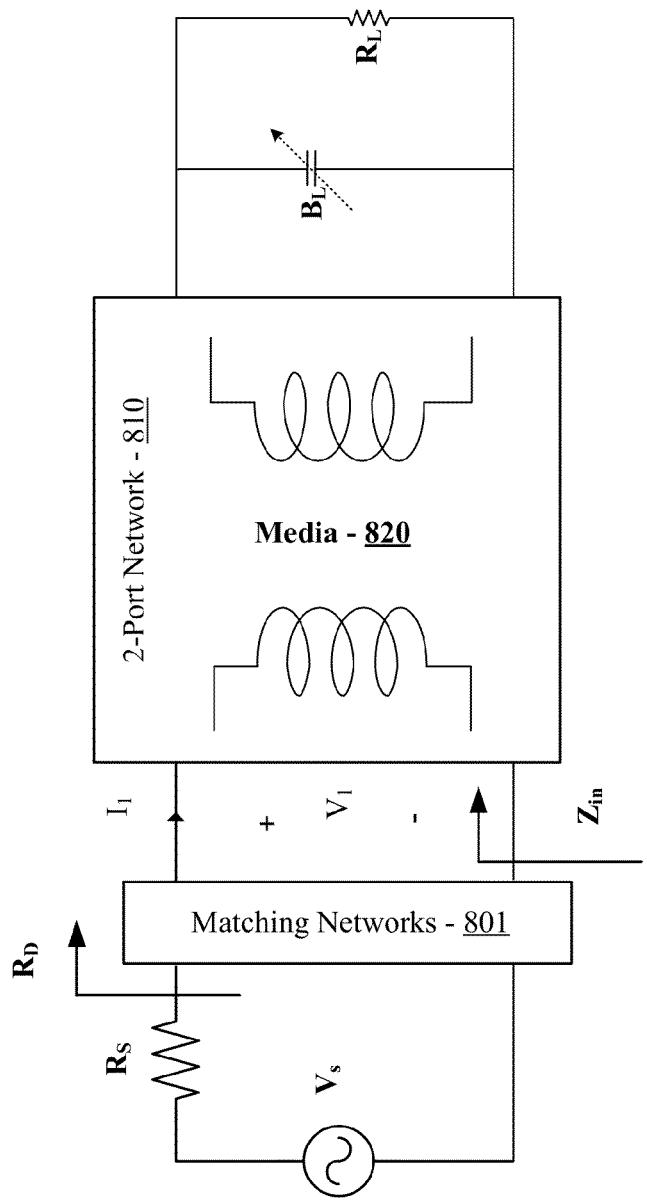
FIG. 8 illustrates a parallel load configuration for optimized coil power transfer efficiency, in accordance with an example embodiment of the disclosure.

In the case of wireless power transfer through biological media for low power applications (≤10 mW at the receiver, for example), a parallel load as shown in FIG. 8, may be utilized.

FIG. 8 illustrates a parallel load configuration for optimized coil power transfer efficiency, in accordance with an example embodiment of the disclosure. Referring to FIG. 8, there is shown matching network 801 and a 2-port network 810 comprising media 820. There is also shown a source signal $V_s$, source resistance $R_s$, input current $I_1$, input voltage $V_1$, input impedance $Z_{in}$, a variable load resistance $R_L$, and a load reactance $B_L$. Under the special case of using mm-sized receiver coils, the coupling is very small ($0.02<\chi<0.2$) which translates to two port efficiencies between 0.5% to 4.5%. Under the given constraint of $iz_{12}, iz_{12} \ll rZ_{11}, iZ_{22}$ the optimum load can be simplified to $$B_L(opt) = \frac{Q_2}{rZ_{22}(Q_2^2+1)}, \qquad (40)$$

and $$R_L(opt) = rZ_{22}(Q_2^2+1). \qquad (41)$$

It is evident from equations (41) and (40) that the optimum load has a very weak dependence on $\chi$. Therefore, the optimum susceptance and load may be fixed very close to the optimum value by design. However, due to variations in the media, silicon active and passive component mismatch, etc., the fixed load could be different from the optimum load by up to 20%.

If we assume that the optimum conductance is known and the susceptance is different from the optimum susceptance by $\alpha$, $B_L = (1+\alpha)B_L(opt)$, the efficiency is given by $$\eta = \frac{\chi}{\left(\alpha \frac{iY_{22}rY_{11} - iY_{12}rY_{12}}{|Y_{12}|^2}\right)^2 \frac{\chi^2}{\sqrt{1+\chi}} + \left(1+\sqrt{1+\chi}\right)^2} \qquad (42)$$

Equation (42) may be rewritten in terms of Z parameters, $$\eta = \frac{\chi}{\left(\alpha \frac{iZ_{22}rZ_{11} - iZ_{12}rZ_{12}}{|Z_{12}|^2}\right)^2 \frac{\chi^2}{\sqrt{1+\chi}} + \left(1+\sqrt{1+\chi}\right)^2} \qquad (43)$$

For cases where the power transfer occurs through air and therefore $rZ_{12}=0$, equation (43) simplifies to:

$$\eta = \frac{\chi}{\frac{\alpha^2 Q_2^2}{\sqrt{1+\chi}} + \left(1+\sqrt{1+\chi}\right)^2} \qquad (44)$$

A similar set of equations may be derived for the percentage of loss in two-port efficiency due to the variations in the real part of the parallel load $R_L = R_L(opt) \times (1+\alpha)$, $$\eta_{tp}(\text{loss}(\%)) = \frac{(1+\chi)\alpha^2 \times 100}{\left(1+\sqrt{1+\chi}+\alpha\right)\left((1+\chi)(1+\alpha)\sqrt{1+\chi}\right)} \qquad (45)$$

where loss is defined as $$\frac{\eta_{max} - \eta}{\eta_{max}} \times 100.$$

It is evident from the above derivations that wireless power transfer systems with low efficiency would greatly suffer from deviations in susceptance. In fact, any time there is low power transfer efficiency due to distance or misalignment, but the receiver coil has been designed with very high Q, deviations can further reduce the efficiency. For example, in a design where the PCB based receiver coil size is limited to a 36 mm² area, the optimization process results in a high Q receiver coil in order to compensate for the smaller receiver area. In this example scenario, the wireless power transfer system thus has a maximum two-port efficiency of 61% in air and the receiver coil quality factor in air is 173. In such a scenario, a 20% deviation from the optimum susceptance, would result in 92% loss in efficiency. Since in most biomedical power transfer applications, the receiver coil is much smaller than the transmitter coil, the power delivery would suffer from a similar sensitivity issue.

Wireless power transfer systems with on-chip coils may also be very sensitive to susceptance variations. In these systems, the best achievable receiver quality factor is usually less than 15, which helps the sensitivity but at the same time, achievable $\chi$ is usually very small ($0.02<\chi<0.2$). The main contributing factor in $B_L$ (opt) uncertainty for such systems is the variation in the inductor fabrication and the circuitry inside the perimeter of the coil. On-chip inductors have around 5% variation, but the effect of the active and passive components that are fabricated along with the coil and are located inside the coil perimeter is hard to predict or simulate. However, measurements show that variations of 20% are possible, which would result in more than 50% loss in efficiency. It is also interesting to note that a conductive media would theoretically have a higher $rZ_{12}$ and thus lower sensitivity compared to wireless power transfer through air. Therefore, the receiver may run an adaptation algorithm to optimize the load susceptance. It can be mathematically proven that the optimum susceptance for a fixed conductance that is not necessarily equal to the optimal conductance is the optimum susceptance. However, the optimum conductance for a fixed susceptance, $B_L(fix)=(1+\alpha)B_L(opt)$, that is not necessarily equal to the optimal susceptance is different from the optimum conductance and is given by:

$$R_L = \frac{rY_{11}}{\sqrt{(rY_{11}rY_{22} + iY_{12}^2)(rY_{11}rY_{22} - rY_{12}^2) - (\alpha)^2(iY_{22}rY_{11} - iY_{12}rY_{12})^2}}. \quad (46)$$

These derivations show that the receiver adaptation algorithm can first optimize the susceptance for using an arbitrary load conductance and then optimize the load conductance to achieve maximum power transfer efficiency. Using equation (10), the change in the efficiency due to misalignments, change in the distance between the coils, or tilting, may be calculated.

The following derivations assume that the structure is using the optimum load for the no misalignment case. These derivations are based on the simple two inductor model shown in FIG. 1. Any misalignment would result in change (usually reduction) in the mutual inductance between the coils. However, at low frequencies, the other two-port parameters tend to stay constant. Therefore, by taking advantage of this fact and in order to capture the deviation from the optimum power efficiency the Taylor series may be derived for equation (10) in terms of Z parameters with respect to $iz_{12}=M\omega$. The following transformations from ABCD parameters to circuit parameters may be utilized for the simple case shown in FIG. 1.

$$A = \frac{L_2\omega - iR_2}{M\omega}, \quad (47)$$

$$B = \frac{-(L_2R_1 + L_1R_2)\omega + i(-L_1L_2\omega^2 + R_1R_2 + M^2\omega^2)}{M\omega},$$

$$C = \frac{i}{M\omega},$$

$$D = \frac{L_1\omega - iR_1}{M\omega}.$$

The Taylor series is therefore given by:

$$\eta_{\Delta M} = \eta_{opt}\left(1 - \frac{2}{\sqrt{1+\chi}}\frac{\Delta M}{M} - \frac{4-3\sqrt{1+\chi}}{1+\chi}\left(\frac{\Delta M}{M}\right)^2\right). \quad (48)$$

Figure 10:
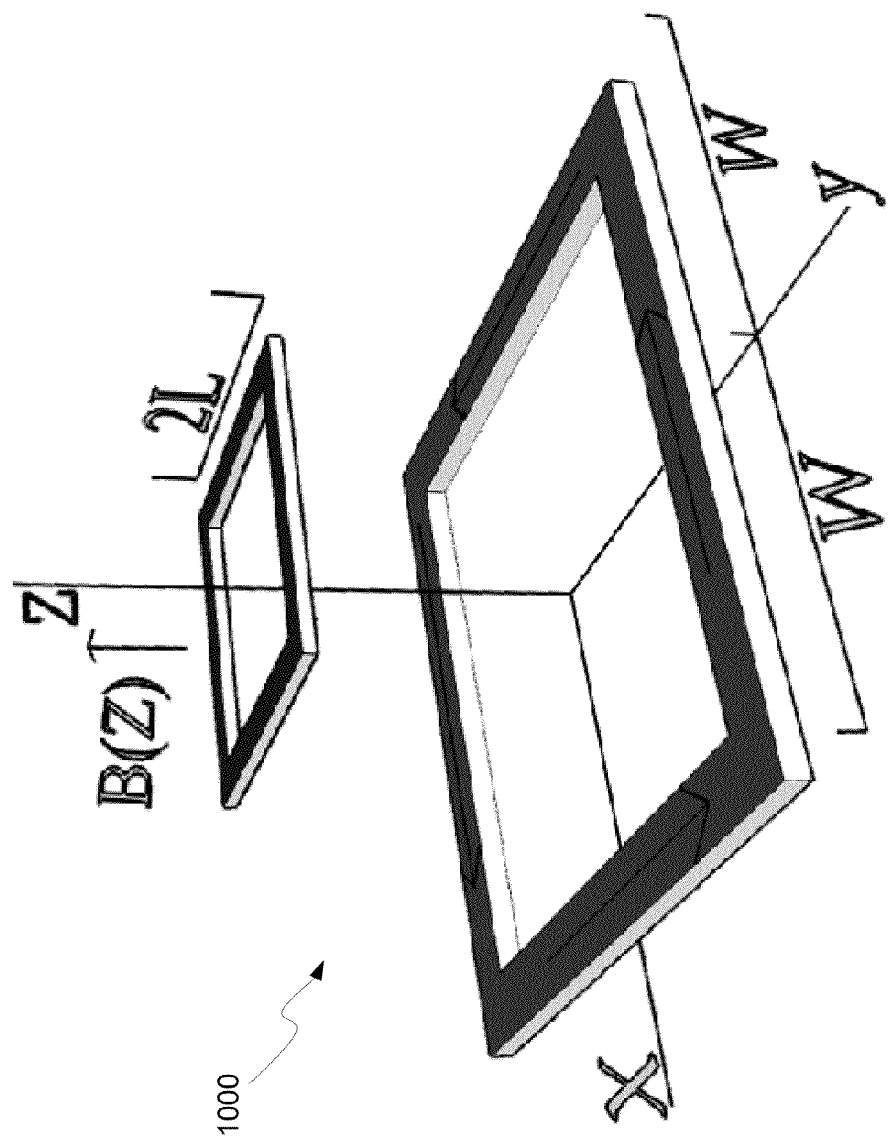
FIG. 10 illustrates a square four-wire loop carrying current I, in accordance with an example embodiment of the disclosure.

The next step is to find $$\frac{\Delta M}{M}$$

as a function of geometry and misalignment. In this disclosure, without loss of generality, we present the example case where both coils have square spiral shape. Similar derivations can be performed on circular structures, for example. Calculating the mutual inductance requires knowledge of the magnetic field generated by one of the coils at each point in space. Without loss of generality, we will assume that the coils are in the xy plane. Therefore, we need the $B_z$ component of the field. A square loop consists of four wires, as illustrated in FIG. 10.

Figure 9:
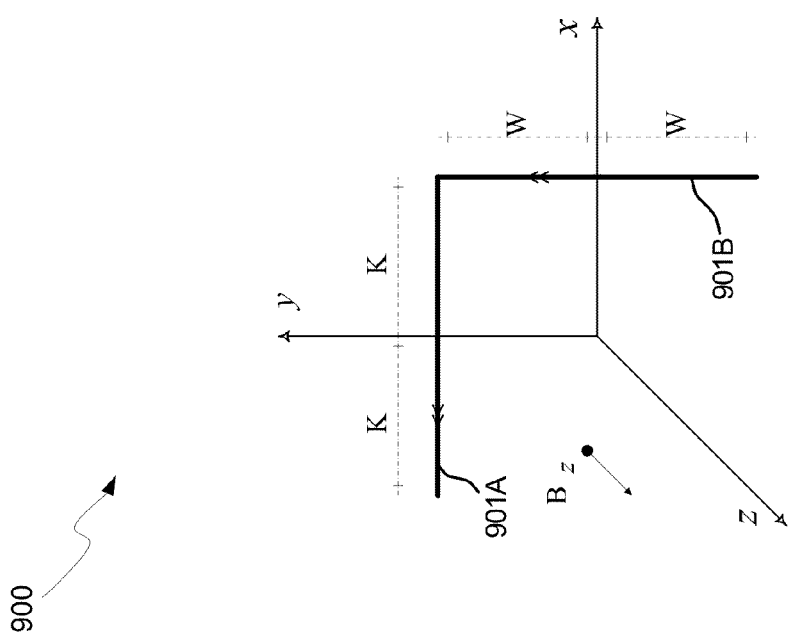
FIG. 9 shows two wire segments of length 2W and 2K, carrying current I, in accordance with an example embodiment of the disclosure.

FIG. 9 shows two wire segments of length 2W and 2K, carrying current I, in accordance with an example embodiment of the disclosure. FIG. 10 illustrates a square four-wire loop carrying current I, in accordance with an example embodiment of the disclosure. The z component of magnetic field, $B_z$, generated by such a loop 1000 at an arbitrary point (x, y, z) can be found using Biot-Savart's law. In order to find the field, the loop may be divided into two segments and the magnetic field may be derived for each portion. The z component of the magnetic field at an arbitrary point (x, y, z) in the space is given by:

$$B_z = \frac{\mu_0 I}{4\pi}\left(\frac{y}{r_1}\left(\frac{1}{\sqrt{r_1^2+(y+W)^2}} - \frac{1}{\sqrt{r_1^2+(y-W)^2}}\right) + \quad (49)$$

$$\frac{W}{r_1}\left(\frac{1}{\sqrt{r_1^2+(y+W)^2}} + \frac{1}{\sqrt{r_1^2+(y-W)^2}}\right)\right)\times$$

$$\frac{K-x}{\sqrt{(x-K)^2+z^2}} +$$

$$\frac{\mu_0 I}{4\pi}\left(\frac{x}{r_2}\left(\frac{1}{\sqrt{r_2^2+(x+K)^2}} - \frac{1}{\sqrt{r_2^2+(x-K)^2}}\right) + \right.$$

$$\left.\frac{K}{r_2}\left(\frac{1}{\sqrt{r_1^2+(x+K)^2}} + \frac{1}{\sqrt{r_1^2+(x-K)^2}}\right)\times\frac{W-y}{\sqrt{(y-W)^2+z^2}}\right.$$

where $$r_1 = \sqrt{(x-K)^2 + z^2}$$

and $$r_2 = \sqrt{(y-W)^2 + z^2}.$$

Now, using equation (49), the equation for the current loop 1000 in FIG. 10 may be derived.

$$B_z = \frac{\mu_0 I}{4\pi}\left(\frac{x+W}{(x+W)^2+z^2}\left(\frac{y+W}{\sqrt{(x+W)^2+z^2+(y+W)^2}} - \frac{y-W}{\sqrt{(x+W)^2+z^2+(y-W)^2}}\right) + \frac{y+W}{(y+W)^2+z^2}\left(\frac{x+W}{\sqrt{(x+W)^2+z^2+(y+W)^2}} - \frac{x-W}{\sqrt{(x-W)^2+z^2+(y+W)^2}}\right) + \frac{x-W}{(x-W)^2+z^2}\left(\frac{y-W}{\sqrt{(x-W)^2+z^2+(y-W)^2}} - \frac{y+W}{\sqrt{(x-W)^2+z^2+(y+W)^2}}\right) + \frac{y-W}{(y-W)^2+z^2}\left(\frac{x-W}{\sqrt{(x-W)^2+z^2+(y-W)^2}} - \frac{x+W}{\sqrt{(x+W)^2+z^2+(y+W)^2}}\right)\right). \tag{50}$$

Where 2W is the length of the edge of the square loop as shown in FIG. 10. In practical cases where the wire traces have finite width, $$W = \frac{\text{Edge Length} - \text{Trace Width}}{2}.$$

For the general case where the coil has N turns, each turn may be treated as an individual loop carrying current I. Therefore, the generated magnetic field at each point in space is the superposition of the fields due to each individual turn, $$B_{tot}(x,y,z) = \sum_{i=1}^{N} B_i(x,y,z). \tag{51}$$

The mutual inductance between two spiral coils $S_1$ with $N_1$ and $S_2$ with $N_2$ turns, respectively, can now be easily calculated using (51) and (50):

$$M = \frac{\sum_{j=1}^{N_2} \int B_{tot} \cdot d_{s_2}(j)}{I}, \tag{52}$$

where $\int B_{tot} \cdot d_{s_2}(j)$ represents an integration over the area of each loop of the receiver, which may be evaluated numerically. These derivations may be utilized to predict the change in efficiency for small misalignments.

Furthermore, the optimum number of matching stages may be determined, as discussed with respect to equation (35). The overall efficiency that we are trying to maximize, using N stages is given by:

$$f(Q_1, Q_2, \ldots, Q_N) = \eta = \prod_{i=1}^{N} \eta_i. \tag{53}$$

The matching network is used to realize a total impedance conversion ratio of $1+Q^2$ so that the following constraint exists on the impedance conversion of the subsections:

$$g(Q_1, Q_2, \ldots, Q_N) = (1+Q^2) - \prod_{i=1}^{N}(1+Q_i^2) = 0. \tag{54}$$

Using Lagrange multipliers method, we can maximize the following equation:

$$f(Q_1, Q_2, \ldots, Q_N) + \alpha g(Q_1, Q_2, \ldots, Q_N). \tag{55}$$

Using simple algebraic manipulations, we find that the maximum of the function occurs when:

$$Q_1 = Q_2 = \ldots = Q_N. \tag{56}$$

Now assuming $$\frac{1}{Q_P} + \frac{1}{Q_S} = Q, \tag{57}$$

the optimum number of stages, N, is given by:

$$N = \frac{\ln(1+Q^2)}{k}, \tag{58}$$

where k is a function of $Q_S$ and $Q_P$ and is approximately $2\pm0.05$ for $50<(Q_p,Q_s)<1000$, therefore for large Q values $$N \approx \ln(Q) \tag{59}$$

as is utilized in equation (35).

In an example embodiment, a method and system are disclosed for maximum efficiency achievable in near-field coupled wireless power transfer systems. In this regard, aspects of the invention may comprise configuring, independently of load impedance and source impedance, coil geometry for a transmit (Tx) coil and a receive (Rx) coil based on a media expected to be between the coils during operation. A desired susceptance and conductance corresponding to the configured coil geometry and expected media may be determined and an impedance of an amplifier for the Tx coil may be configured based on the determined susceptance and conductance.

A load impedance for the Rx coil may be configured based on the determined susceptance and conductance. A matching network may be operatively coupled to the amplifier for the configuring of the impedance of the amplifier. The Rx and/or Tx coil may be integrated on a complementary metal-oxide semiconductor (CMOS) chip or on a PCB or other insulating substrate. One or more matching networks may be integrated on the CMOS chip for the configuring of the load resistance for the Rx coil. The one or more matching networks may comprise a switched capacitor array.

A matching network may be coupled to the Rx coil for the configuring the load impedance for the Rx coil. The desired susceptance and conductance may be configured for a maximum power transmission efficiency. The coil geometry and expected media may comprise a general two-port model. The coil geometry may comprise one or more of: coil area, metal layer thickness, metal layer width, and metal layer spacing. Control commands and/or may be communicated by the Tx and Rx coils. The expected media may comprise one or more of: biological liquid, organic or inorganic substances, biological material, biological agents, biological tissue, chemical compositions, buffer solutions.

As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the term "exemplary" means serving as a non-limiting example, instance, or illustration. As utilized herein, the terms "e.g.," and "for example" set off lists of one or more non-limiting examples, instances, or illustrations. As utilized herein, a device/module/circuitry/etc. is "operable" to perform a function whenever the device/module/circuitry/etc. comprises the necessary hardware and code (if any is necessary) to perform the function, regardless of whether performance of the function is disabled, or not enabled, by some user-configurable setting.

While the invention has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for wireless power transfer, the method comprising:
   configuring, independently of load impedance and source impedance, coil geometry for a transmit (Tx) coil and a receive (Rx) coil based on a media expected to be between the coils during operation;
   determining a desired susceptance and conductance corresponding to the configured coil geometry and expected media;
   configuring a load impedance for an amplifier for the Tx coil based on the determined susceptance and conductance; and
   configuring a load impedance for the Rx coil based on the determined susceptance and conductance.

2. The method according to claim 1, comprising operatively coupling a matching network to the amplifier for said configuring said load impedance for the amplifier.

3. The method according to claim 1, wherein the Rx coil is integrated on a complementary metal-oxide semiconductor (CMOS) chip.

4. The method according to claim 3, wherein one or more matching networks are integrated on the CMOS chip for said configuring the load impedance for the Rx coil.

5. The method according to claim 4, wherein the one or more matching networks comprise a configurable impedance bank comprising capacitors and/or inductors.

6. The method according to claim 5, comprising adaptively configuring the load impedance for the Rx coil utilizing the configurable impedance bank.

7. The method according to claim 3, wherein a portion of a matching network for configuring the load impedance for the Rx coil is mounted to a surface of the CMOS chip.

8. The method according to claim 1, wherein the Tx coil is integrated on a printed circuit board (PCB) or other insulating substrate.

9. The method according to claim 6, wherein matching networks are integrated on said PCB or insulating substrate for said configuring the load impedance for the amplifier for the Tx coil.

10. The method according to claim 1, comprising communicating control commands and/or data utilizing the Tx and Rx coils.

11. The method according to claim 1, comprising operatively coupling a matching network to the Rx coil for said configuring a load impedance for the Rx coil.

12. The method according to claim 1, comprising configuring the desired susceptance and conductance for a maximum power transmission efficiency.

13. The method according to claim 1, wherein the coil geometry and expected media comprises a general two-port model.

14. The method according to claim 1, wherein the coil geometry comprises one or more of: coil area, metal layer thickness, metal layer width, and metal layer spacing.

15. The method according to claim 1, wherein the expected media comprises one or more of: biological liquid, organic or inorganic substances, biological material, biological agents, biological tissue, chemical compositions, buffer solutions.

16. A system for wireless power transfer, the system comprising:
   a coil geometry for a transmit (Tx) coil and a receive (Rx) coil configured based on a media expected to be between the coils during operation but configured independent of a load impedance and source impedance;
   a determined susceptance and conductance corresponding to the configured coil geometry and expected media;
   a load impedance for an amplifier for the Tx coil, said impedance configured based on the determined susceptance and conductance; and
   a load impedance configured for the Rx coil based on the determined susceptance and conductance.

17. The system according to claim 16, wherein a matching network is operatively coupled to the amplifier for said configured impedance of the amplifier.

18. The system according to claim 16, wherein the Rx coil is integrated on a complementary metal-oxide semiconductor (CMOS) chip.

19. The system according to claim 18, wherein one or more matching networks are integrated on the CMOS chip for said configuring the load impedance for the Rx coil.

20. The system according to claim 19, wherein the one or more matching networks comprise a configurable impedance bank comprising capacitors and/or inductors.

21. The system according to claim 20, wherein the load impedance for the Rx coil is adaptively configured utilizing the configurable impedance bank.

22. The system according to claim 17, wherein a portion of a matching network for configuring the load impedance for the Rx coil is mounted to a surface of the CMOS chip.

23. The system according to claim 16, wherein the Tx coil is integrated on a printed circuit board (PCB) or other insulating substrate.

24. The system according to claim 23, wherein matching networks are integrated on said PCB or insulating substrate for said configuring the load impedance for the amplifier for the Tx coil.

25. The system according to claim 16, wherein a matching network is operatively coupled to the Rx coil for said configured load impedance for the Rx coil.

26. The system according to claim 19, wherein the desired susceptance and conductance are configured for a maximum power transmission efficiency.

27. The system according to claim 16, wherein the coil geometry and expected media comprises a general two-port model.

28. The system according to claim 16, wherein the coil geometry comprises one or more of: coil area, metal layer thickness, metal layer width, and metal layer spacing.

29. The system according to claim 16, wherein the expected media comprises one or more of: biological liquid, organic or inorganic substances, biological material, biological agents, biological tissue, chemical compositions, buffer solutions.

30. A system for wireless power transfer, the system comprising:
a coil geometry for a transmit (Tx) coil on a printed circuit board and a receive (Rx) coil on a complimentary metal-oxide semiconductor (CMOS) chip, said Tx coil and Rx coil configured based on a biological media expected to be between the coils during operation but configured independent of a configurable load impedance and source impedance, said Rx coil integrated on a chip with the configurable load impedance;
a determined susceptance and conductance corresponding to the configured coil geometry and expected media;
a load impedance for an amplifier for the Tx coil, said impedance configured based on the determined susceptance and conductance; and
a load impedance configured for the Rx coil based on the determined susceptance and conductance.

* * * * *